(12) United States Patent
Hong et al.

(10) Patent No.: US 9,041,001 B2
(45) Date of Patent: *May 26, 2015

(54) THIN FILM TRANSISTOR ARRAY PANEL AND MANUFACTURING METHOD THEREOF

(71) Applicant: SAMSUNG DISPLAY CO., LTD., Yongin, Gyeonggi-Do (KR)

(72) Inventors: Pil Soon Hong, Gwangmyeong-si (KR); Gwui-Hyun Park, Osan-si (KR); Jin-Su Byun, Seongnam-si (KR); Sang Gab Kim, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/151,658

(22) Filed: Jan. 9, 2014

(65) Prior Publication Data

US 2014/0124786 A1 May 8, 2014

Related U.S. Application Data

(63) Continuation of application No. 13/424,278, filed on Mar. 19, 2012, now Pat. No. 8,653,530.

(30) Foreign Application Priority Data

Oct. 7, 2011 (KR) .................. 10-2011-0102550

(51) Int. Cl.
*H01L 27/12* (2006.01)
*H01L 29/417* (2006.01)

(52) U.S. Cl.
CPC ........ *H01L 27/124* (2013.01); *H01L 29/41733* (2013.01)

(58) Field of Classification Search
USPC ......................................................... 257/72
See application file for complete search history.

(56) References Cited

U.S. PATENT DOCUMENTS

| 5,982,460 | A  | 11/1999 | Zhang et al.    |
| 6,310,362 | B1 | 10/2001 | Takemura        |
| 6,696,324 | B2 | 2/2004  | Hong et al.     |
| 6,771,328 | B2 | 8/2004  | Park et al.     |
| 7,242,440 | B2 | 7/2007  | Kurashina et al.|
| 7,368,755 | B2 | 5/2008  | Jeoung et al.   |

(Continued)

FOREIGN PATENT DOCUMENTS

| JP | 09-265114   | 10/1997 |
| JP | 2004-004991 | 1/2004  |

(Continued)

*Primary Examiner* — Thao P Le
(74) *Attorney, Agent, or Firm* — Innovation Counsel LLP

(57) ABSTRACT

The present invention relates to a thin film transistor array panel and a manufacturing method thereof that prevent disconnection of wiring due to misalignment of a mask, and simplify a process and reduce cost by reducing the number of masks. The thin film transistor array panel according to the disclosure includes a source electrode enclosing an outer part of the first contact hole and formed on the second insulating layer; a drain electrode enclosing an outer part of the second contact hole and formed on the second insulating layer; a first connection electrode connecting the source region of the semiconductor layer and the source electrode through the first contact hole; and a second connection electrode connecting the drain region of the semiconductor layer and the drain electrode through the second contact hole.

1 Claim, 9 Drawing Sheets

(56) References Cited

U.S. PATENT DOCUMENTS

| | | |
|---|---|---|
| 7,436,463 B2 | 10/2008 | Yamazaki |
| 7,507,594 B2 | 3/2009 | Seo et al. |
| 7,507,996 B2 | 3/2009 | Hong et al. |
| 7,754,541 B2 | 7/2010 | Takeguchi et al. |
| 8,653,530 B2 * | 2/2014 | Hong et al. .................. 257/72 |
| 2005/0041170 A1 | 2/2005 | Chae |
| 2005/0062409 A1 | 3/2005 | Yamazaki et al. |
| 2007/0263133 A1 | 11/2007 | Yamazaki |
| 2007/0296885 A1 | 12/2007 | Kim et al. |
| 2007/0298548 A1 | 12/2007 | Nagata et al. |
| 2008/0169470 A1 | 7/2008 | Lim et al. |
| 2009/0250701 A1 | 10/2009 | Kimura |
| 2011/0057192 A1 | 3/2011 | Nakamura et al. |

FOREIGN PATENT DOCUMENTS

| | | |
|---|---|---|
| KR | 100491820 | 5/2005 |
| KR | 1020060124850 | 12/2006 |
| KR | 1020060135429 | 12/2006 |
| KR | 1020080055194 | 6/2008 |
| KR | 101003669 | 12/2010 |

* cited by examiner

THIN FILM TRANSISTOR ARRAY PANEL AND MANUFACTURING METHOD THEREOF

CROSS-REFERENCE TO RELATED APPLICATION

This application is a continuation application of U.S. patent application Ser. No. 13/424,278 filed on Mar. 19, 2012, which claims priority to Korean Patent Application No. 10-2011-0102550 filed in the Korean Intellectual Property Office on Oct. 7, 2011 in the Korean Intellectual Property Office (KIPO), and all the benefits accruing therefrom under 35 U.S.C. §119, the contents of the prior applications being herein incorporated by reference.

BACKGROUND (a) Field of the Invention

The present disclosure relates to a thin film transistor array panel and a manufacturing method thereof. More particularly, the disclosure relates to a thin film transistor array panel and a manufacturing method thereof that prevents a disconnection of wiring due to misalignment of a mask, and that simplifies and reduces the cost of a process by reducing the number of masks.

(b) Description of the Related Art

A thin film transistor is generally used as a switching element to independently drive a pixel in a flat display device such as a liquid crystal display or an organic light emitting device. The thin film transistor array panel includes a thin film transistor, a pixel electrode that is connected thereto, a gate line that transmits a gate signal to the thin film transistor, and a data line that transmits a data signal.

The thin film transistor includes a gate electrode that is connected to the gate line, a source electrode that is connected to the data line, a drain electrode that is connected to the pixel electrode, and a semiconductor layer that is disposed on the gate electrode between the source electrode and drain electrode, and the data signal is transmitted to the pixel electrode from the data line according to the gate signal from the gate line.

The thin film transistor array panel is formed by performing a plurality of photo and etching processes after forming a metal layer on a substrate and aligning a mask. After a photo and etching process is performed for aligning a first mask on the substrate, the photo and etching process is similarly performed for aligning a second mask. When the second mask and the first mask are misaligned, a desired pattern may not be obtained.

For example, a process of forming a contact hole exposing the semiconductor layer by using the first mask to form a source electrode and a drain electrode connected to a semiconductor layer and forming the source electrode and the drain electrode connected to the semiconductor layer through the contact hole by using the second mask may be performed. When the second mask is misaligned from the first mask, the source electrode and the drain electrode are only formed in a partial region inside the contact hole such that the semiconductor layer is not normally connected.

The above information disclosed in this Background section is only for enhancement of understanding of background information and therefore it may contain information that does not form the prior art that is already known in this country to a person of ordinary skill in the art.

SUMMARY

The disclosure provides a thin film transistor array panel and a manufacturing method thereof that prevent a disconnection of wiring due to misalignment of a mask.

Also, a thin film transistor array panel and a manufacturing method thereof that simplify a process and reduce cost by reducing the number of masks are provided.

DETAILED DESCRIPTION

Figure 1:
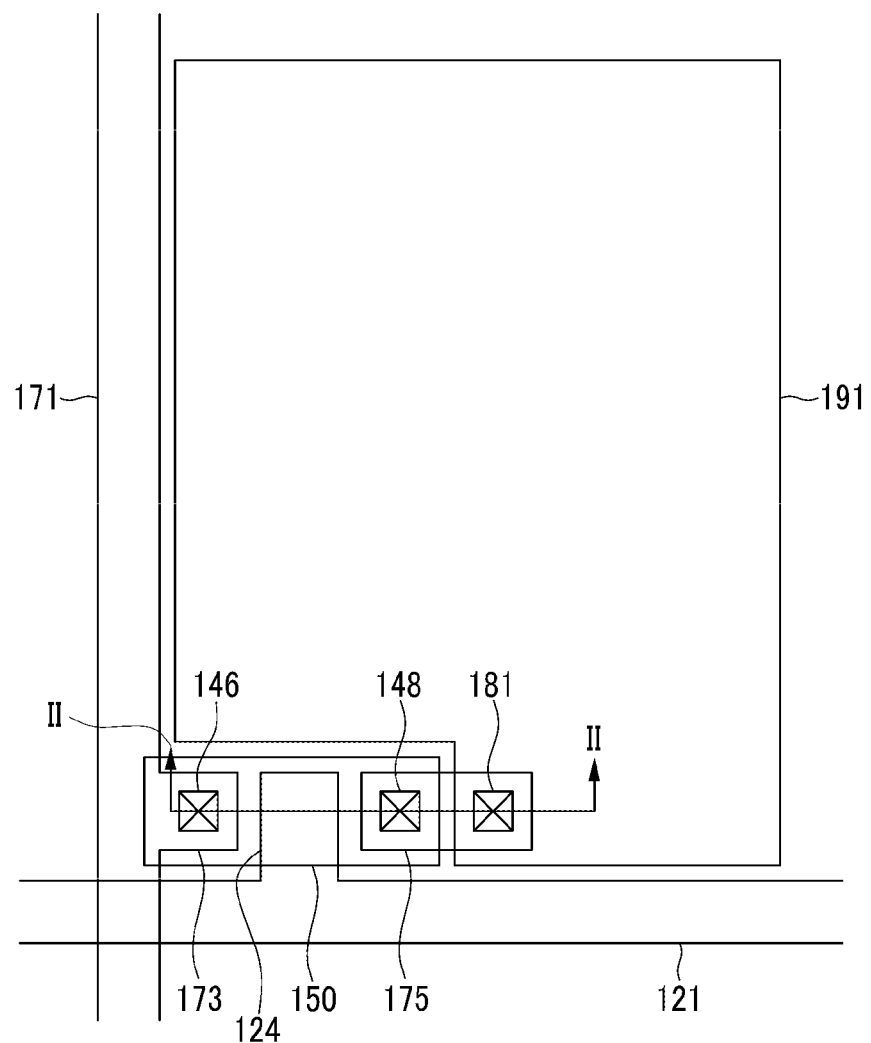
FIG. 1 is a layout view of one pixel of a thin film transistor array panel according to an exemplary embodiment.

The disclosure will be described more fully hereinafter with reference to the accompanying drawings, in which exemplary embodiments are shown. As those skilled in the art would realize, the described embodiments may be modified in various different ways, all without departing from the intended spirit or scope.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Firstly, a thin film transistor array panel according to an exemplary embodiment will be described with reference to accompanying drawings.

Figure 2:
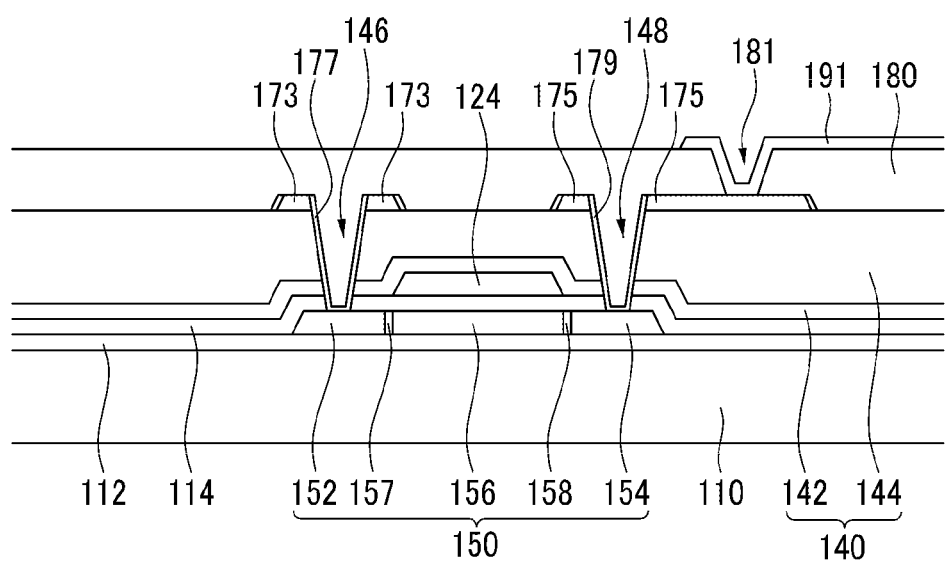
FIG. 2 is a cross-sectional view of the thin film transistor according to an exemplary embodiment of FIG. 1 taken along the line II-II.

FIG. 1 is a layout view of one pixel of a thin film transistor array panel according to an exemplary embodiment, and FIG. 2 is a cross-sectional view of the thin film transistor according to an exemplary embodiment of FIG. 1 taken along the line II-II.

A semiconductor layer 150 made of polysilicon is formed on a substrate 110 of a thin film transistor array panel according to an exemplary embodiment. The semiconductor layer 150 includes a source region 152, a drain region 154, and a channel region 156 interposed between the source region 152 and the drain region 154.

The semiconductor layer 150 may further include a first lightly doped region 157 doped with a low concentration of impurities between the source region 152 and the channel region 156, and a second lightly doped region 158 doped with a low concentration of impurities between the drain region 154 and the channel region 156.

A first insulating layer 114 is formed on the whole surface of the substrate 110 including the semiconductor layer 150.

A gate electrode 124 overlapping the channel region 156 of the semiconductor layer 150 is formed on the first insulating layer 114. The semiconductor layer 150 positioned under the left side of the gate electrode 124 corresponds to the source region 152, and the semiconductor layer 150 positioned under the right side of the gate electrode 124 corresponds to the drain region 154.

A gate line 121 extending in one direction is formed on the first insulating layer 114, and the gate electrode 124 is protruded from the gate line 121.

A second insulating layer 140 is formed on the whole surface of the substrate 110 including the gate electrode 124. The second insulating layer 140 may be made of a dual-layered structure including a second lower insulating layer 142 made of an inorganic insulating material and a second upper insulating layer 144 made of an organic insulating material. Alternatively, the second lower insulating layer 142 may be made of the organic insulating material and the second upper insulating layer 144 may be made of the inorganic insulating material, and the second insulating layer 140 may be made of a single layer.

The first insulating layer 114 and the second insulating layer 140 include a first contact hole 146 exposing at least a portion of the source region 152 of the semiconductor layer 150 and a second contact hole 148 exposing at least a portion of the drain region 154.

A source electrode 173 enclosing an outer part of the first contact hole 146 is formed on the second insulating layer 140. A data line 171 intersecting the gate line 121 is formed on the second insulating layer 140, and the source electrode 173 is protruded from the data line 171. A drain electrode 175 enclosing the outer part of the second contact hole 148 is formed on the second insulating layer 140.

A first connection electrode 177 is formed inside the first contact hole 146, and the first connection electrode 177 connects the source region 152 of the semiconductor layer 150 and the source electrode 173 through the first contact hole 146. The first connection electrode 177 is formed to cover the side of the source electrode 173, and may not be formed at the upper surface of the source electrode 173. The first connection electrode 177 may be extended to cover the side of the data line 171.

A second connection electrode 179 is formed inside the second contact hole 148, and the second connection electrode 179 connects the drain region 154 of the semiconductor layer 150 and the drain electrode 175 through the second contact hole 148. The second connection electrode 179 is formed to cover the side of the drain electrode 175, and may not be formed at the upper surface of the drain electrode 175.

The first contact hole 146, the second contact hole 148, the source electrode 173, the drain electrode 175, the first connection electrode 177, and the second connection electrode 179 may be formed by using one mask. The mask that is used may be a slit mask or a half-tone mask. The process of forming the first contact hole 146, the second contact hole 148, the source electrode 173, the drain electrode 175, the first connection electrode 177, and the second connection electrode 179 will be described in the description of the manufacturing method.

A third insulating layer 180 is formed on the whole surface of the substrate 110 including the source electrode 173 and the drain electrode 175.

The third insulating layer 180 has a third contact hole 181 exposing at least a portion of the drain electrode 175.

A pixel electrode 191 connected to the drain electrode 175 through the third contact hole 181 is formed on the third insulating layer 180. The gate line 121 and the data line 171 intersect each other thereby defining a pixel area, and the pixel electrode 191 may be formed in the pixel area.

A buffer layer 112 may be further formed between the substrate 110 and the semiconductor layer 150. The semiconductor layer 150 may be formed directly on the substrate 110, and as shown in FIG. 2, the buffer layer 112 may be formed directly on the substrate 110 and the semiconductor layer 150 may be formed on the buffer layer 112. The buffer layer 112 prevents the semiconductor layer 150 from being influenced by foreign particles of the substrate 110.

Next, a manufacturing method of a thin film transistor array panel according to an exemplary embodiment will be described with reference to accompanying drawings.

Figure 3A:
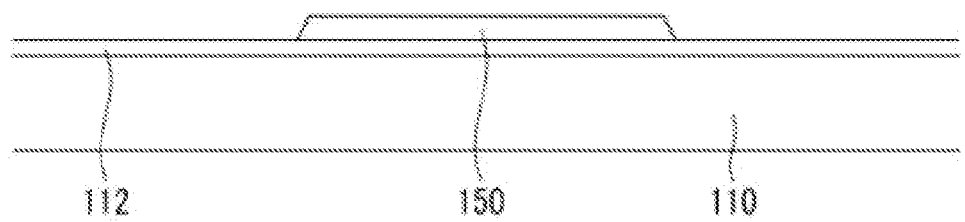
FIG. 3A to FIG. 3N are cross-sectional views showing a manufacturing method of a thin film transistor array panel according to an exemplary embodiment.
Figure 3B:
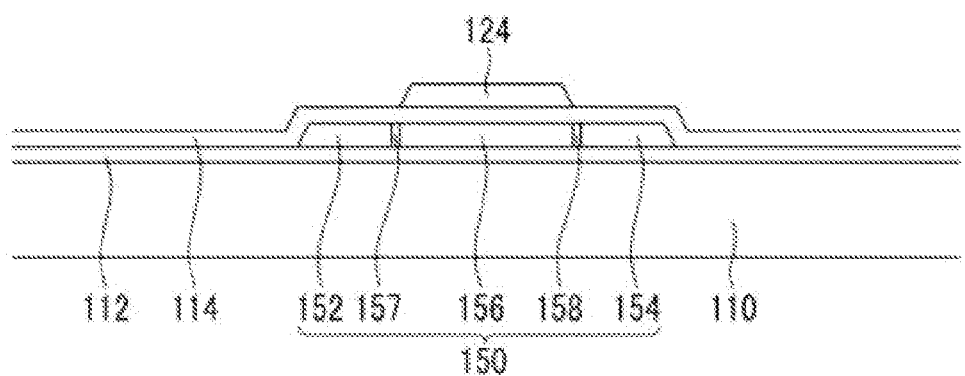
Figure 3C:
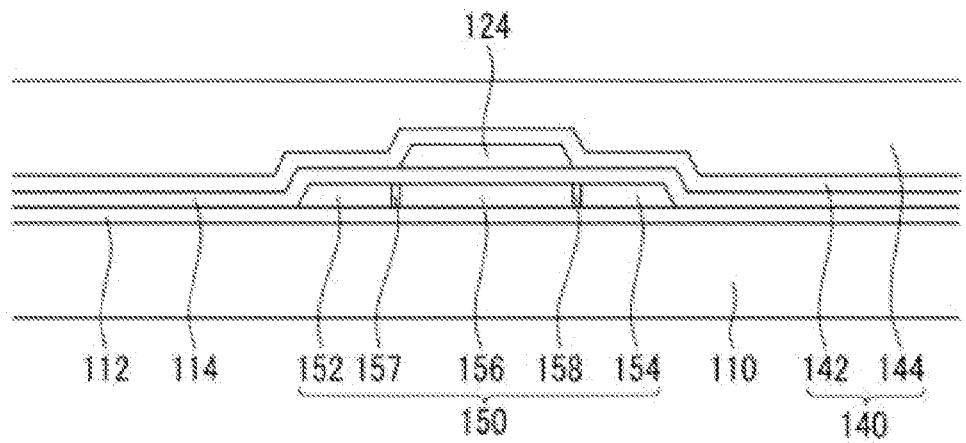
Figure 3D:
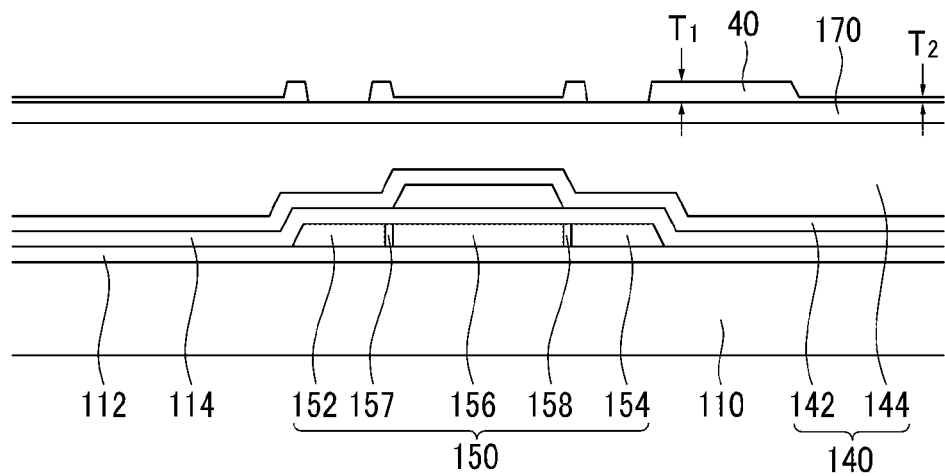
Figure 3E:
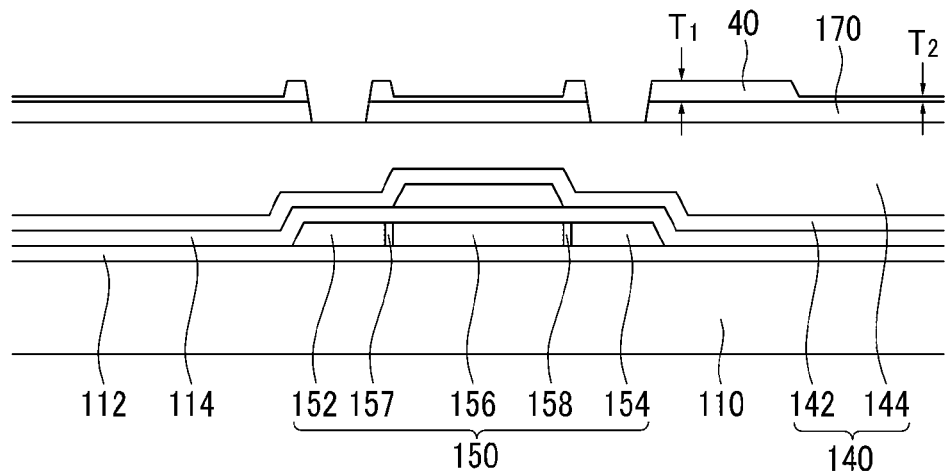
Figure 3F:
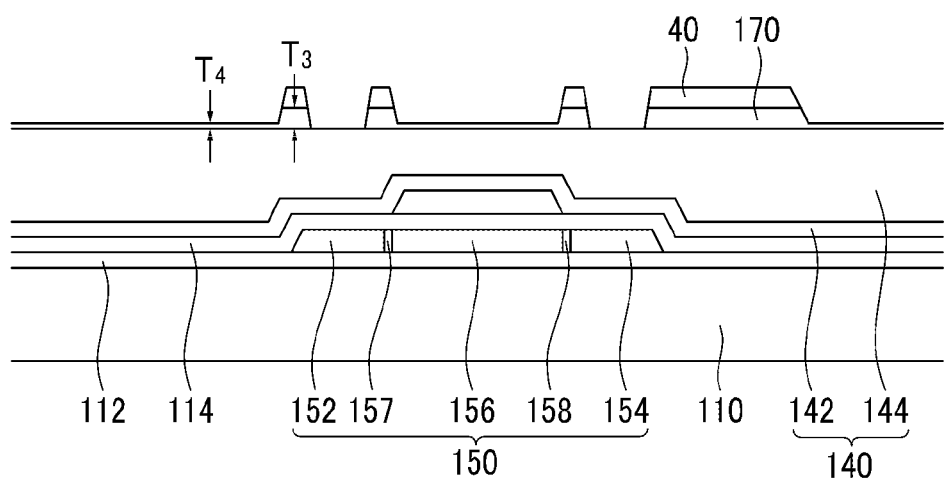
Figure 3G:
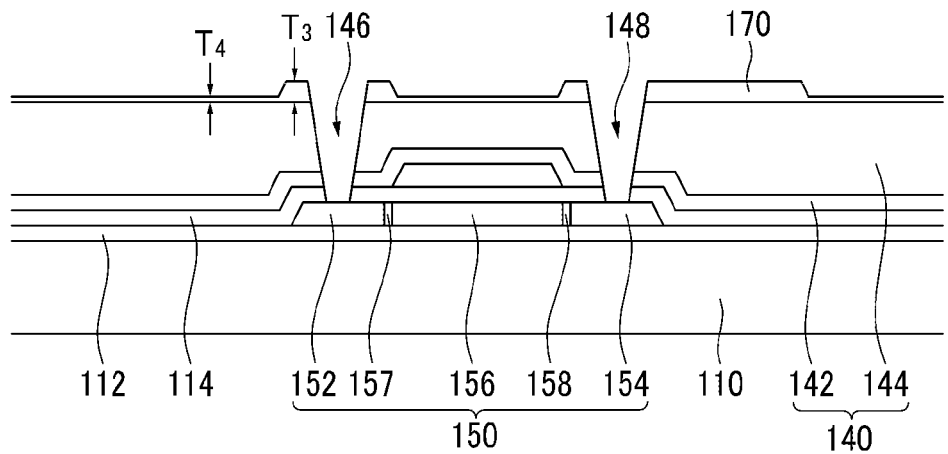
Figure 3H:
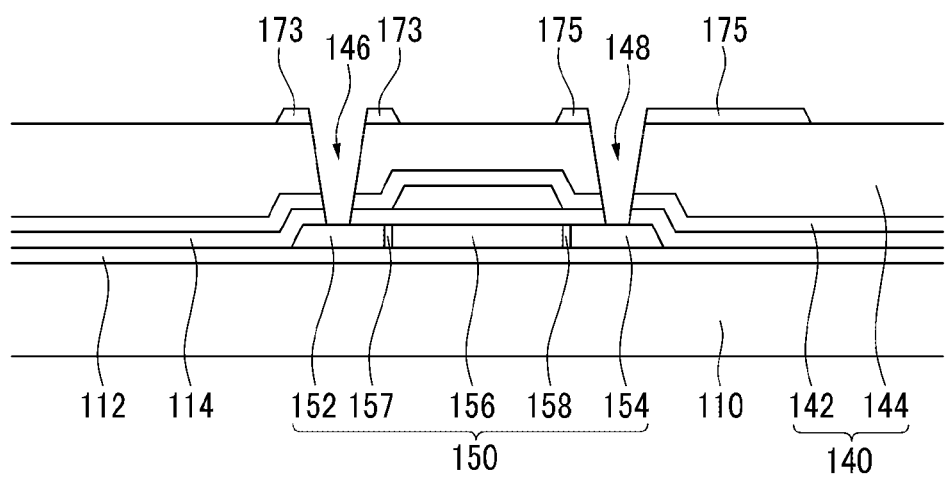
Figure 3I:
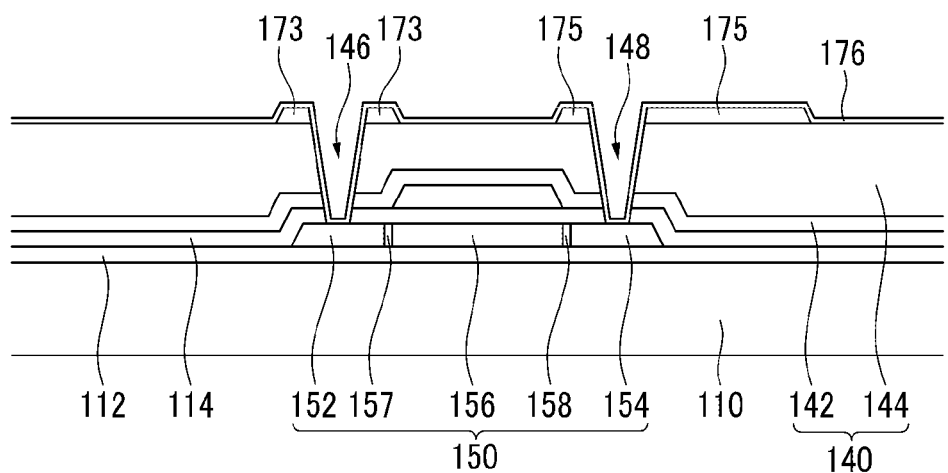
Figure 3J:
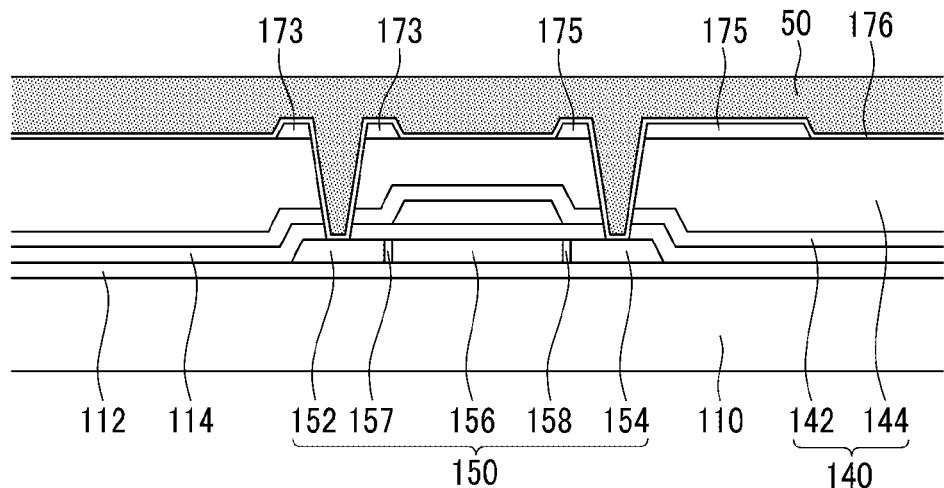
Figure 3K:
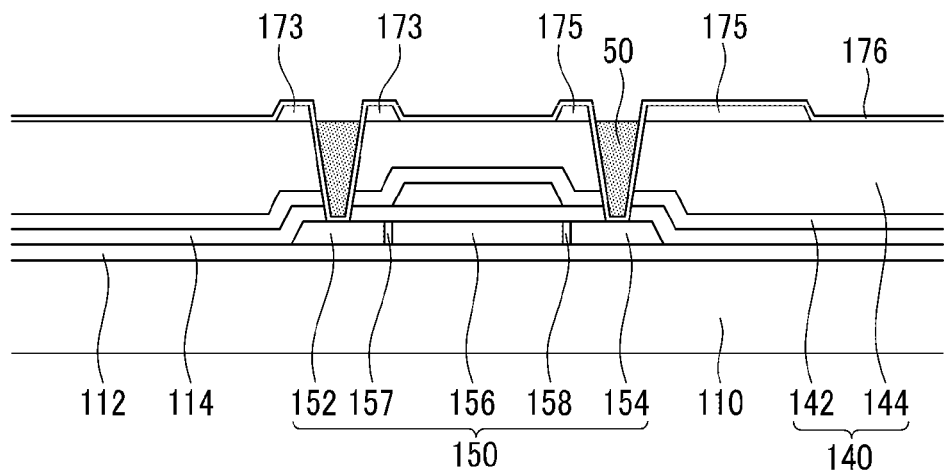
Figure 3L:
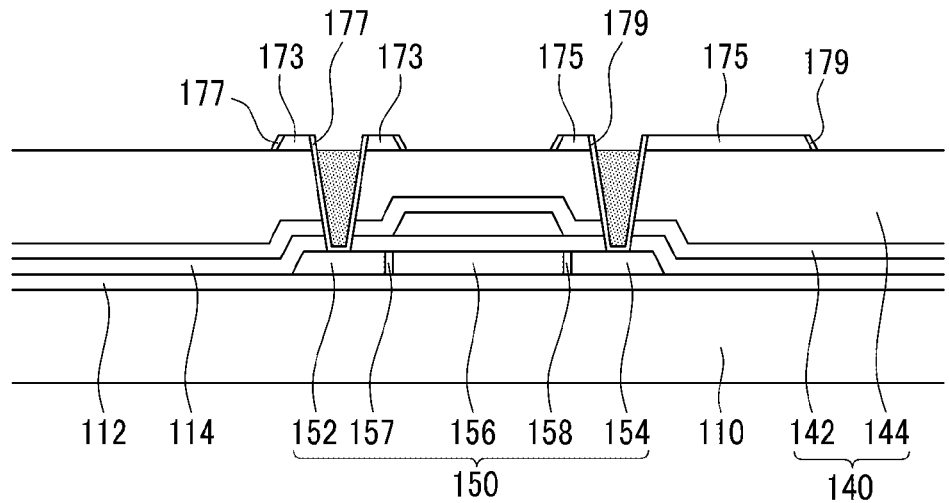
Figure 3M:
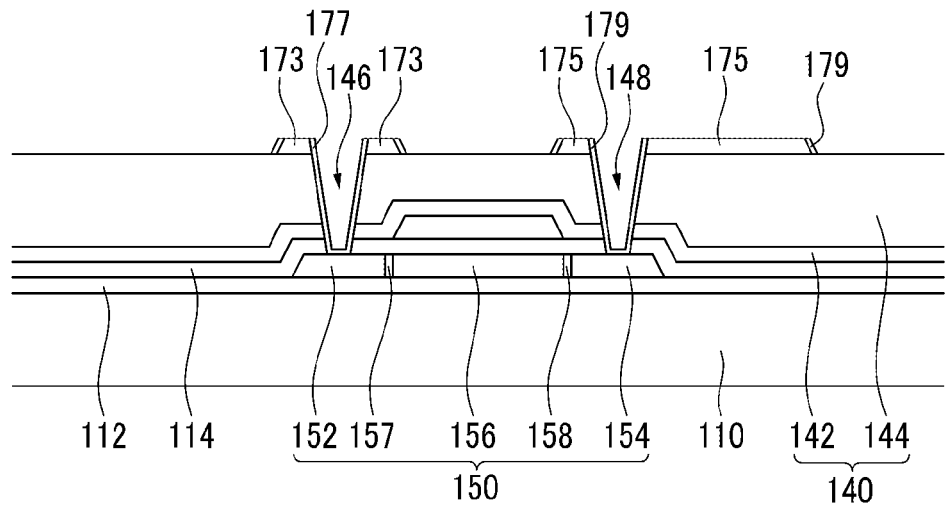
Figure 3N:
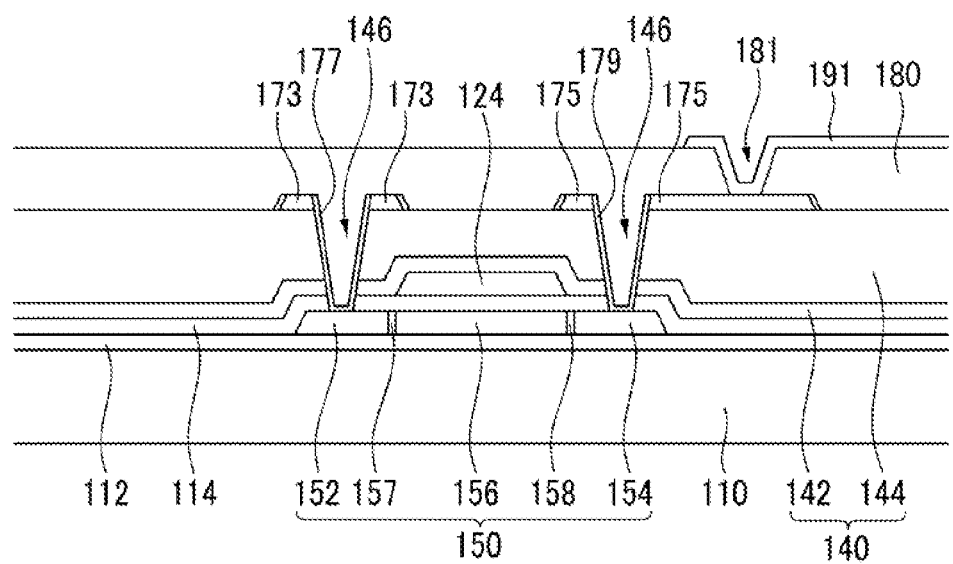

FIG. 3A to FIG. 3N are cross-sectional views of a process of a manufacturing method of a thin film transistor array panel according to an exemplary embodiment.

Firstly, as shown in FIG. 3A, the buffer 112 is formed on the substrate 110 that is made of glass or plastic.

An amorphous silicon layer is formed on the buffer layer 112 and is patterned, and is then crystallized through a heating etc. to form the semiconductor layer 150. After crystallizing the amorphous silicon layer, it may be patterned to form the semiconductor layer 150.

The process of forming the buffer layer 112 may be omitted, and when forming the buffer layer 112, the foreign particles of the substrate 110 may be suppressed from penetrating and damaging the semiconductor layer 150 in the process of forming the semiconductor layer 150.

As shown in FIG. 3B, the first insulating layer 114 is formed on the whole surface of the substrate 110 including the semiconductor layer 150.

Next, the gate line (not shown) extending in one direction and the gate electrode 124 protruded from the gate line are formed by using a metal material on the first insulating layer. At least a portion of the gate electrode 124 overlaps the semiconductor layer 150, and in detail, at the center of the semiconductor layer.

Next, ions are doped to the semiconductor layer 150 by using the gate electrode 124 as a mask to form the source region 152 and the drain region 154. The source region 152 is positioned at the left side under the gate electrode 124 and the drain region 154 is positioned at the right side under the gate electrode 124. Accordingly, the channel region 156 is formed under the gate electrode 124 between the source region 152 and the drain region 154.

The first lightly doped region 157 and the second lightly doped region 158 that are doped with a low concentration of impurities are formed at both sides with respect to the channel region 156. The first lightly doped region 157 is positioned between the source region 152 and the channel region 156, and the second lightly doped region 158 is positioned between the drain region 154 and the channel region 156.

As shown in FIG. 3C, the second insulating layer 140 is formed on the whole surface of the substrate 110 including the gate electrode 124.

The second insulating layer 140 may include the second lower insulating layer 142 and the second upper insulating layer 144. Firstly, the second lower insulating layer 142 is formed on the whole surface of the substrate 110 including the gate electrode 124 using the inorganic insulating material, and the second upper insulating layer 144 is formed on the second lower insulating layer 142 using the organic insulating material.

Alternatively, the second lower insulating layer 142 is formed on the whole surface of the substrate 110 including the gate electrode 124 using the organic insulating material, and the second upper insulating layer 144 is formed on the second lower insulating layer 142 using the inorganic insulating material. Also, the second insulating layer 140 may be formed as a single layer.

As shown in FIG. 3D, a first metal layer 170 is formed on the second insulating layer 140 by using the metal material.

Next, a photosensitive material is coated on the first metal layer 170, and is exposed and developed by using a mask to form a first photosensitive film 40 having a first thickness $T_1$ and a second thickness $T_2$. At this time, the mask that is used may be a slit mask or a half-tone mask. For example, a photosensitive material corresponding to a portion where a pattern is not formed in the mask is removed, the first photosensitive film 40 having the first thickness $T_1$ is formed corresponding to a portion where the pattern is formed in the mask, and the first photosensitive film 40 having the second thickness $T_2$ is formed corresponding to a portion where a slit pattern is formed in the mask.

As shown in FIG. 3E, a portion of the first metal layer 170 is removed by using the first photosensitive film 40 as a mask. If the first metal layer 170 is etched by using the first photosensitive film 40 as a mask, the first metal layer 170 corresponding to a portion where the first photosensitive film 40 is not formed is removed.

At this time, the portion where the first metal layer 170 is removed corresponds to portions positioned on the source region 152 and the drain region 154 of the semiconductor layer 150.

As shown in FIG. 3F, the first photosensitive film 40 is ashed to remove the first photosensitive film 40 having the second thickness $T_2$.

Next, the thickness of the first metal layer 170 is decreased by using the ashed first photosensitive film 40 as the mask. If the first metal layer 170 is etched by using the ashed first photosensitive film 40 as the mask, the thickness of the first metal layer 170 corresponding to the portion where the first photosensitive film 40 is removed is decreased. At this time, the first metal layer 170 is etched by setting time and intensity to maintain a fourth thickness $T_4$ such that the first metal layer 170 corresponding to the portion where the first photosensitive film 40 is not removed. The first metal layer 170 positioned under the portion where the first photosensitive film 40 is maintained has a third thickness $T_3$, and the third thickness $T_3$ is thicker than the fourth thickness $T_4$.

As shown in FIG. 3G, the maintained first photosensitive film 40 is removed.

Next, by using the first metal layer 170 as a mask, the first insulating layer 114 and the second insulating layer 140 are etched to form the first contact hole 146 and the second contact hole 148. The first contact hole 146 exposes at least a portion of the source region 152 of the semiconductor layer 150, and the second contact hole 148 exposes at least a portion of the drain region 154 of the semiconductor layer 150.

By using the first metal layer 170 as a mask in the process of forming the first contact hole 146 and the second contact hole 148, etching having high selectivity may be executed compared with using the photosensitive film that is not a metal as a mask. Accordingly, the first photosensitive film 40 may be relatively thinly formed.

Alternatively, it is possible for the first contact hole 146 and the second contact hole 148 to be firstly formed, and then the first photosensitive film 40 is removed.

As shown in FIG. 3H, the first metal layer 170 is wholly etched. At this time, a condition for removing the first metal layer 170 of which the thickness is etched is applied. That is, the etching of the time and the intensity that are capable of removing the first metal layer 170 having the fourth thickness 14 is executed such that the entire thickness of the first metal layer 170 is decreased. Accordingly, the first metal layer 170 originally having the third thickness $T_3$ has a thinner thickness than the third thickness T3.

The maintained first metal layer 170 forms the data line (not shown), the source electrode 173, and the drain electrode 175. That is, by wholly etching the first metal layer 170, the data line intersecting the gate line is formed. Also, the source electrode 173 enclosing the outer part of the first contact hole 146 and protruded from the data line is formed on the second insulating layer 140, and the drain electrode 175 enclosing the outer part of the second contact hole 148 is formed on the second insulating layer 140.

In the etching step of the first metal layer 170, the source region 152 and the drain region 154 of the semiconductor layer 150 may be damaged through the first contact hole 146 and the second contact hole 148. At this time, an annealing process is performed at a temperature of about 350 degrees for about 30 minutes, and thereby the damaged source region 152 and drain region 154 of the semiconductor layer 150 may be recovered.

As shown in FIG. 3I, the second metal layer 176 formed on the whole surface of the substrate 110 including the source electrode 173 and the drain electrode 175 is formed by using the metal material. The second metal layer 176 is formed within the first contact hole 146 and the second contact hole 148.

As shown in FIG. 3J, a second photosensitive film 50 is formed on the second metal layer 176. The second photosensitive film 50 has a sufficient thickness to be flat throughout the entire region of the substrate 110.

As shown in FIG. 3K, the second photosensitive film 50 is ashed to only maintain the second photosensitive film 50 filled in the first contact hole 146 and the second contact hole 148.

As shown in FIG. 3L, the whole surface of the second metal layer 176 is etched by using the second photosensitive film 50 as a mask. At this time, a condition that is capable of removing the second metal layer 176 formed directly on the second insulating layer 140 is applied. Accordingly, the second metal layer 176 positioned directly on the source electrode 173 and the drain electrode 175 is also removed.

The maintained second metal layer 176 forms the first connection electrode 177 and the second connection electrode 179. That is, by wholly etching the second metal layer 176, the first connection electrode 177 connecting the source region 152 of the semiconductor layer 150 and the source electrode 173 through the first contact hole 146 is formed, and the second connection electrode 179 connecting the drain region 154 of the semiconductor layer 150 and the drain electrode 175 through the second contact hole 148 is formed.

The second metal layer 176 is etched by dry etching, and the dry etching is anisotropic such that the second metal layer 176 positioned in the horizontal direction with respect to the substrate 110 is removed, and the second metal layer 176 having an angle of more than about 70 degrees with the substrate 110 is not removed. Accordingly, the first connection electrode 177 covers the side of the source electrode 173 and the second connection electrode 179 covers the side of the drain electrode 175.

Although not shown, the first connection electrode 177 may be formed to cover the side of the data line.

As shown in FIG. 3M, the remaining second photosensitive film 50 is removed. At this time, oxygen gas is supplied directly after the etching process of the second metal layer 176 is finished such that the maintained second photosensitive film 50 in the first contact hole 146 and second contact hole 148 after the second photosensitive film 50 is ashed may be completely removed.

As shown in FIG. 3N, the third insulating layer 180 is formed on the source electrode 173 and the drain electrode 175.

Next, the third insulating layer 180 is patterned to form the third contact hole 181 exposing at least a portion of the drain electrode 175.

Next, the pixel electrode 191 connected to the drain electrode 175 through the third contact hole 181 is formed.

While this the subject matter disclosed herein has been described in connection with what is presently considered to be practical exemplary embodiments, it is to be understood that it is not limited to the disclosed embodiments, but, on the contrary, is intended to cover various modifications and equivalent arrangements included within the spirit and scope of the appended claims.

What is claimed is:

1. A thin film transistor array panel comprising:
   a substrate;
   a semiconductor layer formed on the substrate, the semiconductor layer including a source region and a drain region;
   at least one insulating layer formed on the semiconductor layer;
   a first contact hole and a second contact hole exposing at least portions of the source region and the drain region of the semiconductor layer and formed in the at least one insulating layer;
   a source electrode formed from a first layer of material, the source electrode substantially surrounding an outer perimeter of the first contact hole and formed on the at least one insulating layer;
   a drain electrode formed from the first layer of material, the drain electrode substantially surrounding an outer perimeter of the second contact hole and formed on the at least one insulating layer;
   a first connection electrode formed from a second layer of material different from the first layer, the first connection electrode connected to both the source region of the semiconductor layer and the source electrode through the first contact hole; and
   a second connection electrode formed from the second layer of material, the second connection electrode connected to both the drain region of the semiconductor layer and the drain electrode through the second contact hole.

* * * * *